United States Patent [19]

Pham

[11] Patent Number: 4,815,114
[45] Date of Patent: Mar. 21, 1989

[54] ELEMENTARY BINARY COUNTER, SYNCHRONOUS BINARY COUNTER AND FREQUENCY DIVIDER IN WHICH SAID ELEMENTARY COUNTER IS EMPLOYED

[75] Inventor: Ngu T. Pham, Paris, France

[73] Assignee: Thomson-CSF, Paris, France

[21] Appl. No.: 21,232

[22] Filed: Mar. 3, 1987

[30] Foreign Application Priority Data

Mar. 7, 1986 [FR] France .................. 86 03287

[51] Int. Cl.[4] .................. H03K 23/42; H03K 23/48
[52] U.S. Cl. .................. 377/110; 377/111; 377/116
[58] Field of Search .............. 377/115, 116, 117, 111, 377/110; 307/471

[56] References Cited

U.S. PATENT DOCUMENTS

| | | | |
|---|---|---|---|
| 3,354,295 | 11/1967 | Kulka | 377/115 |
| 4,037,085 | 7/1977 | Minorikawa | 377/116 |
| 4,637,038 | 1/1987 | Boyle | 377/111 |
| 4,656,649 | 4/1987 | Takahashi | 377/111 |
| 4,669,101 | 5/1987 | McCombs | 377/116 |

FOREIGN PATENT DOCUMENTS

| | | |
|---|---|---|
| 3216712 | 11/1983 | Fed. Rep. of Germany . |
| 1532207 | 7/1968 | France . |
| 2166483 | 8/1973 | France . |
| 2122785 | 1/1984 | United Kingdom . |

Primary Examiner—John S. Heyman
Attorney, Agent, or Firm—Oblon, Fisher, Spivak, McClelland & Maier

[57] ABSTRACT

A stable binary counter as applicable to synchronous counters, to frequency dividers and more particularly to microwave integrated circuits is constituted by a plurality of elementary counters mounted in cascade. Each elementary counter is formed by a half-adder having two inputs, one "sum" output and one "carry" output. The "sum" output is connected to the input of a master-slave flip-flop, the output of which is connected in a feedback loop to one input of the half-adder. The master and slave flip-flops are controlled by the two complementary waveforms of a single clock signal. The "carry" output of one half-adder is connected to the input of the following half-adder.

5 Claims, 2 Drawing Sheets

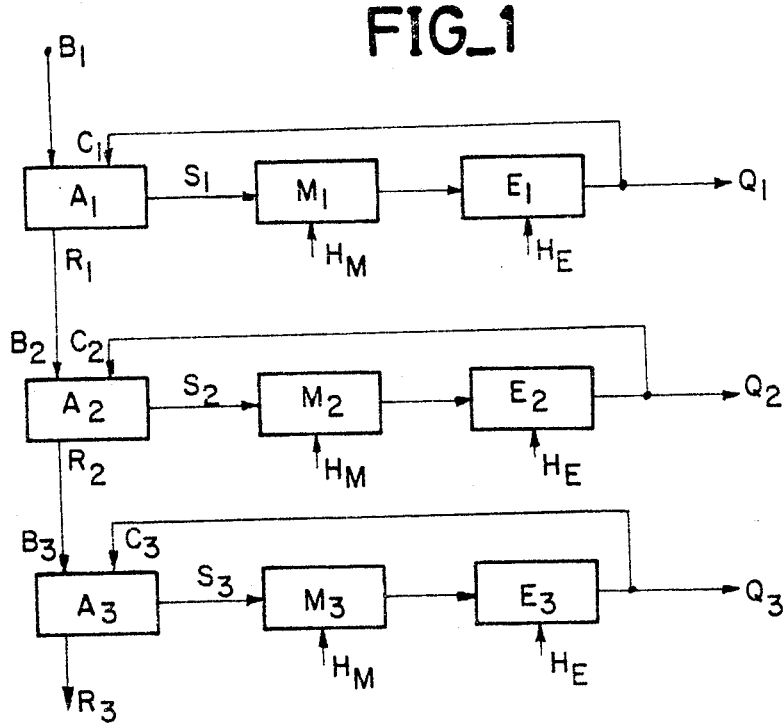
FIG_1
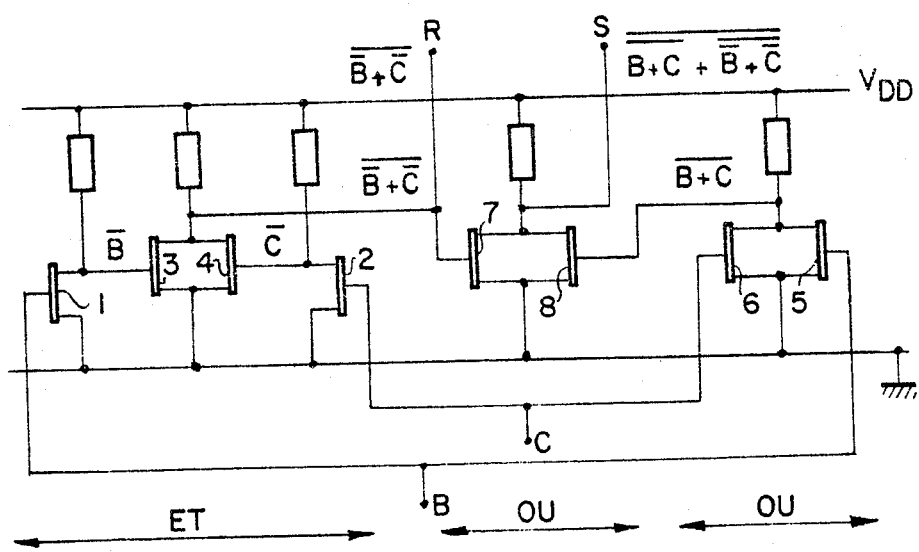
FIG_2

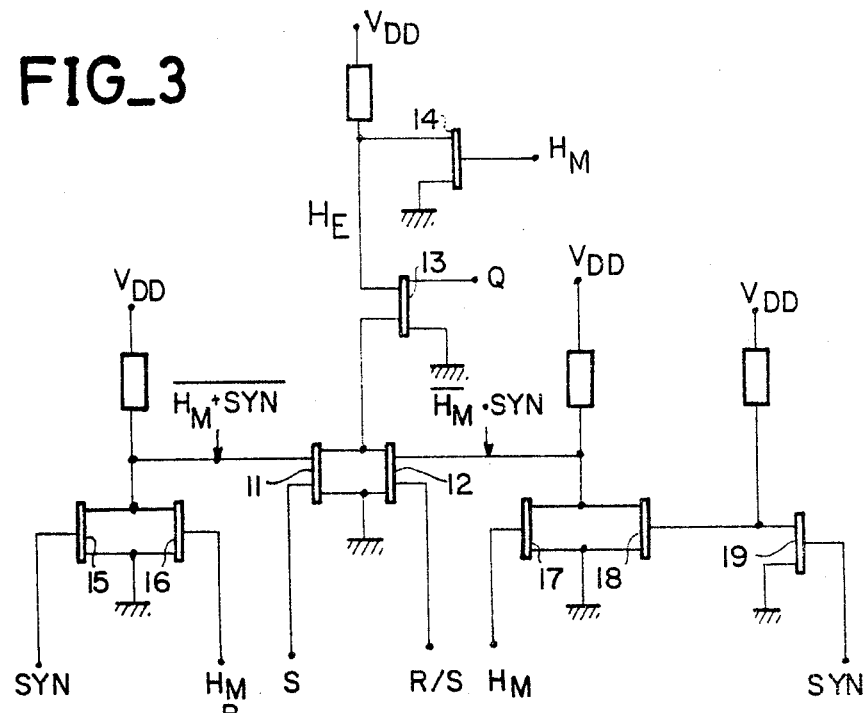
FIG_3
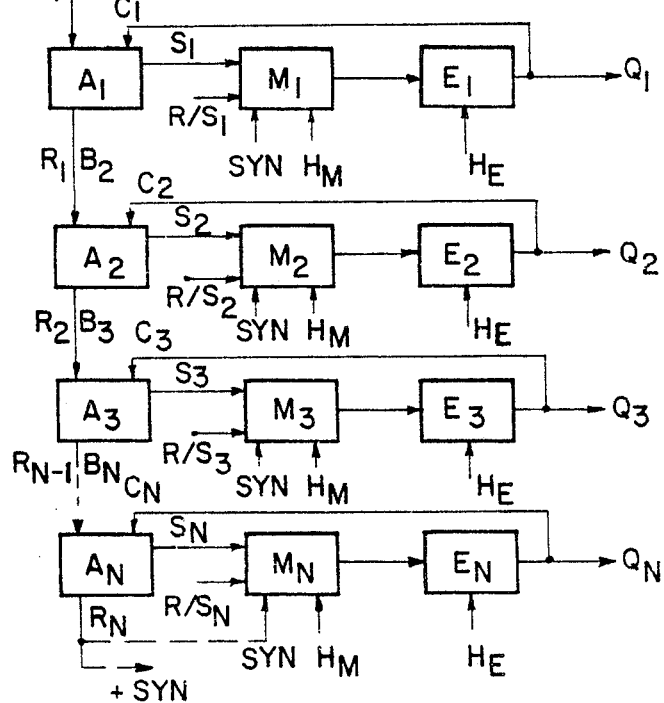
FIG_4

ELEMENTARY BINARY COUNTER, SYNCHRONOUS BINARY COUNTER AND FREQUENCY DIVIDER IN WHICH SAID ELEMENTARY COUNTER IS EMPLOYED

BACKGROUND OF THE INVENTION

1. Field of the Invention

The present invention relates to a synchronous binary counter as well as to a frequency synthesizer which is obtained from the binary counter by causing said synthesizer to divide its own clock frequency and by employing only the last output of the counter.

The counter in accordance with the invention can be employed in a number of different ways in the form of discrete components or integrated circuits by making use of bipolar transistors or field-effect transistors but is of interest primarily in the microwave frequency field in the form of an integrated circuit on high-speed materials such as GaAs or other group III-V materials.

2. Description of the Prior Art

There are a number of means in existence for constructing binary counters, the most simple expedient being to mount scale-of-two dividers in cascade. In the case of high-ratio divisions, however, the last stages must be very stable by reason of the periods of increasing length. In point of fact, the static flip-flops employed in the prior art are not always sufficiently stable.

The synchronous binary counter in accordance with the invention can be constructed with static flip-flops but also with dynamic flip-flops which are faster, have lower power consumption and call for a smaller number of components, which is an advantage in the field of integrated circuit fabrication. However, the primary advantage of the counter circuit in accordance with the invention is that it operates with a single high-frequency clock signal and therefore has much higher stability. In more precise terms, the two clock signal which actuate the counter are the two complementary signals of a single clock. There is therefore no relative displacement between them since they are derived from a single clock signal.

SUMMARY OF THE INVENTION

The binary counter in accordance with the invention includes a plurality of cascade-mounted stages which are identical with each other. Each stage constitutes an elementary counter composed of a half-adder and of a master-slave flip-flop connected to the "sum" output of the half-adder. One of the inputs of the half-adder constitutes the input of the elementary counter. The other input of the half-adder is connected to the output of the slave flip-flop which also constitutes the output of the elementary counter. The "carry" output of the half-adder constitutes the input of the following stage in the synchronous counter.

More specifically, the invention provides a single-output elementary binary counter including a half-adder having two inputs, one "sum" output and one "carry" output and further including a master-slave flip-flop. Said elementary counter has the following distinctive features:

the first input of the half-adder constitutes the input of the elementary counter;

the "sum" output of the half-adder is connected to the input of the master flip-flop;

the output of the slave flip-flip which constitutes the binary output of the counter is connected to the second input of the half-adder;

the master and slave flip-flops are controlled in addition by a single clock signal having one waveform applied to the master flip-flop and a complementary waveform applied to the slave flip-flop.

BRIEF DESCRIPTION OF THE DRAWINGS

FIG. 1 is a basic block diagram of a counter in accordance invention.

FIG. 2 is an electrical diagram of a half-adder employed in a counter in accordance with the invention.

FIG. 3 is an electrical diagram of a master-slave flip-flop employed in a counter in accordance with the invention.

FIG. 4 is a block diagram of a synchronous counter in accordance with the invention.

DETAILED DESCRIPTION OF THE INVENTION

In the basic diagram of FIG. 1 which illustrates a binary counter in accordance with the invention, only three stages are shown for the sake of enhanced clarity but it will be apparent that this does not imply any limitation in regard to the scope of the invention. Thus the number N of stages is related to the number $2^N$ to be counted.

In this counter, each stage constitutes an elementary counter composed of a half-adder $A_1$ and of a master-slave flip-flop $M_1$-$E_1$ actuated by the complementary signals of a single clock. $H_M$ will designate the signal which controls the master flip-flop and $H_E = \overline{H}_M$ will designate the signal which controls the slave flip-flop.

A half-adder is constituted by an exclusive-OR gate and an AND-gate in parallel. The signals B and C to be added are addressed to the two inputs of the OR-gate and to the two inputs of the AND-gate. The output S of the OR circuit yields the sum and the output R of the AND circuit produces the carry.

Each elementary counter therefore includes a half-adder $A_1$, the "sum" output $S_1$ of which is recopied by a master-slave flip-flop $M_1$-$E_1$, the output $Q_1$ of which is connected in a feedback loop to one input $C_1$ of the half-adder $A_1$. The other input $B_1$ of the half-adder $A_1$ constitutes the input of the elementary counter or stage. The output $Q_1$ of the slave flip-flop $E_1$ constitutes the output of the stage. The carry output $R_1$ is addressed to the input of the following stage in the cascade.

In a diagram of the type shown in FIG. 1, all the outputs $Q_1$, $Q_2$, $Q_3$ are employed if the circuit is used in a binary counter. Only the last output $Q_3$ is employed if the circuit is used in a frequency divider.

The truth table of a half-adder is as follows:

| B | C | S | R |
|---|---|---|---|
| 0 | 0 | 0 | 0 |
| 1 | 0 | 1 | 0 |
| 0 | 1 | 1 | 0 |
| 1 | 1 | 0 | 1 |

The master-slave flip-flop recopies the sum signal $S_1$ so as to restitute said signal at $Q_1$ at the following clock cycle. During the slave flip-flop reading period, we have the relations:

in the case of the first stage: $Q_1 = C_1$ $S_1 = B_1 \oplus C_1 = B_1 \oplus Q_1$ (exclusive-OR)

$R_1 = B_1 \cdot C_1 = B_1 \cdot Q_1 = B_2$ (logical AND)

in the case of the second stage: $Q_2 = C_2$ $S_2 = B_2 \oplus C_2 = R_1 \oplus Q_2$ $R_2 = B_2 \cdot C_2 = R_1 \cdot Q_2 = B_3$ in the case of the third stage: $Q_3 = C_3$ $S_3 = B_3 \oplus C_3 = R_2 \oplus Q_3$ $R_3 = B_3 \cdot C_3 = R_2 \cdot Q_3$ In the following clock cycle, we have new values at the outputs:
$Q'_1$ recopies $S_1$
$Q'_2$ recopies $S_2$
$Q'_3$ recopies $S_3$ It is only necessary to replace $Q_1$, $Q_2$, $Q_3$ by $Q'_1$, $Q'_2$, $Q'_3$ in the foregoing relations in order to have new values:

$S'_1 = B_1 \oplus S_1$ because $Q_1$ has become $Q'_1 = S_1$ $R'_1 = B_1 S_1$ $S'_2 = R'_1 \oplus S_2$ because $R_1$ has become $R'_1$
$R'_2 = R'_1 \cdot S_2$ and $Q_2$ has become $Q'_2 = S_2$ $S'_3 = R'_2 \oplus S_3$ by analogous reasoning
$R'_3 = R'_2 \cdot S_3$ Two cases are possible. If $B_1$ = logical 0, then in accordance with the truth table of a logic half-adder, we have:

$S'_1 = S_1 \quad S'_2 = S_2 \quad S'_3 = S_3$
$R'_1 = 0 \quad R'_2 = 0 \quad R'_3 = 0$ and the counter remains in a state which is identical with its previous state, all the inputs $B_1$ and $R_1$ being logically 0.

If $B_1$ = logical 1:
$S'_1 = \overline{S_1}$
$R'_1 = S_1$ $S'_2 = R'_1 \oplus S_2 = S_1 \oplus S_2$ $R'_2 = R'_1 \cdot S_2 = S_1 \cdot S_2$ etc.

The first stage has changed in value and the counter has progressed by one unit.

The progression of the counter is apparent from the table given below and established in respect of a three-stage counter. Postulating that $B_1$ = logical 1 and that the starting position is $Q_1 = Q_2 = Q_3 = 0$, then $S_1$, $R_1, S_2, R_2, S_3, R_3$ are computed by means of the truth table of a half-adder. In the following cycle, $Q_1$ recopies $S_1$, $Q_2$ recopies $S_2$, $Q_3$ recopies $S_3$: $R_1$, $R_2$, $R_3$ and so on in sequence are computed at each cycle.

If $B_1$ = logical 0, the counter retains its last value and does not change.

| Cycle | $B_1$ | $Q_1$ | $S_1$ | $R_1$ | $Q_2$ | $S_2$ | $R_2$ | $Q_3$ | $S_3$ | $R_3$ |
|---|---|---|---|---|---|---|---|---|---|---|
| 0 | 1 | 0 | 1 | 0 | 0 | 0 | 0 | 0 | 0 | 0 |
| 1 | 1 | 1 | 0 | 1 | 0 | 1 | 0 | 0 | 0 | 0 |
| 2 | 1 | 0 | 1 | 0 | 1 | 1 | 0 | 0 | 0 | 0 |
| 3 | 1 | 1 | 0 | 1 | 1 | 0 | 1 | 0 | 1 | 0 |
| 4 | 1 | 0 | 1 | 0 | 0 | 0 | 0 | 1 | 1 | 0 |
| 5 | 1 | 1 | 0 | 1 | 0 | 1 | 0 | 1 | 1 | 0 |
| 6 | 1 | 0 | 1 | 0 | 1 | 1 | 0 | 1 | 1 | 0 |
| 7 | 1 | 1 | 0 | 1 | 1 | 0 | 1 | 1 | 0 | 1 |
| 8 | 1 | 0 | 1 | 0 | 0 | 0 | 0 | 0 | 0 | 0 |

In this table, the inputs and outputs of a given elementary counter or stage are grouped together within the rectangles. The arrows recall that, in a given cycle, the output $Q_1$ recopies the output $S_1$ in the previous cycle.

Reading of the counter is performed on the outputs $Q_1$, $Q_2$, $Q_3$ of the master-slave flip-flops. For example, in the sixth cycle, we have:
$Q_1 = 0$ weight 0, coefficient 0
$Q_2 = 1$ weight 1, coefficient 1
$Q_3 = 1$ weight 2, coefficient 1
which yields a number:

$$N = 0 \cdot 2^0 + 1 \cdot 2^1 + 1 \cdot 2^2 = 6$$

A counter in accordance with the invention and formed of N stages or elementary counters mounted in cascade is capable of counting up to b $2^N$.

This counter has the further advantage of receiving synchronization signals constituted by the "carry" output $R_N$ of the last stage. This output is not addressed to a following stage but its application will be explained in detail with reference to the following figures. Synchronization is essential for automatic zero-resets and for realizing a programmable frequency divider.

Any suitable type of half-adders and master-slave flip-flops may be used for the construction of the counter in accordance with the invention, the operation of which has been described in the foregoing. However, FIGS. 2 and 3 are two diagrams illustrating two particularly advantageous applications if the transistors are two-dimensional electron-gas transistors and if the load resistors are saturated loads or in other words gateless transistors.

FIG. 2 is an electrical diagram of a half-adder having two inputs B and C as well as two outputs, namely a "sum" output S and a "carry" output R.

Said adder is composed of eight transistors connected in parallel. If they are field-effect transistors, their sources are connected to ground and their drains are supplied with a voltage $V_{DD}$ via load resistors.

The AND function is performed by two inverters 1 and 2 and by an OR inverter which is therefore a NOR circuit. The signal B is fed onto the gate of the inverter 1, the drain of which delivers the complement $\overline{B}$ to the gate of the NOR-circuit transistor 3. The signal C is applied to the gate of the inverter 2, the drain of which delivers the complement $\overline{C}$ to the gate of the NOR-circuit transistor 4. In consequence, the output signal of the NOR circuit is $$\overline{\overline{B+C}} = (\text{AND-function}) B \cdot C$$

and is fed onto the output R of the half-adder.

The exclusive-OR function is performed by two OR inverters which are therefore two NOR circuits. The signals B and C are applied respectively to the gates of two transistors 5 and 6 mounted as a first NOR circuit, the output of which is therefore $\overline{B+C}$.

Finally, the signal $\overline{\overline{B+C}}$ derived from the AND function and the signal $\overline{B+C}$ derived from the first NOR circuit are applied respectively to the gates of two transistors 7 and 8 mounted as a second NOR circuit. The "sum" signal is collected from the drains of the second NOR circuit and the "carry" signal is collected at the output of the AND circuit. It is thus clear that we have in fact:

$$S = \overline{\overline{B + C} + B + C} = (\overline{B} + \overline{C}) \cdot (B + C)$$
(exclusive-OR)

$$R = \overline{\overline{B + C}} = B \cdot C \qquad (\text{AND})$$

FIG. 3 is an electrical diagram of a master-slave flip-flop provided with an R/S (reset-set) forcing input synchronized with the clock $H_M$.

The master flip-flop is composed of two parallel-connected transistors 11 and 12 having two gates with sources connected to ground and drains connected together.

The gate on the source side of the transistor 11 constitutes the input S of the master flip-flop and is connected to the output S of the half-adder of FIG. 2. The gate on the drain side of the transistor 11 is controlled by the output signal of an inverter OR-gate formed by two transistors 15 and 16. Thus the gate of one transistor is controlled by the clock signal $H_M$ and the gate of the other transistor is controlled by the synchronization signal SYN which is the carry $R_N$ of the last stage of the counter (as shown in FIG. 4). The gate on the drain side of the transistor 11 is therefore controlled by a signal of the form
$$\overline{H_M + SYN}$$

The gate on the source side of the transistor 12 constitutes the R/S forcing input. The gate on the drain side of the transistor 12 is controlled by the output signal of an inverter OR-gate formed by two transistors 17 and 18. Thus the gate of the transistor 17 is controlled by the clock signal $H_M$ and the gate of the transistor 18 is controlled via an inverter 19 by the synchronization signal SYN. The gate on the drain side of the transistor 12 is therefore controlled by a signal of the form
$$\overline{H_M + \overline{SYN}} \text{ hence } \overline{H} \cdot \text{SYN}$$

Conduction of the transistors 11 and 12 is therefore initiated in alternate sequence.

The slave flip-flop is composed of a transistor 13 having two gates, a source connected to ground and a drain which constitutes the output Q of the master-slave flip-flop. In the diagram of FIG. 1, the point Q is connected as a feedback loop to the input C of the half-adder at each stage.

The gate on the source side of the transistor 13 is controlled by the signal derived from the master flip-flop or in other words collected from the drains of the transistors 11 and 12. The gate on the drain side of the transistor 13 is controlled by the clock signal $H_E$ which is complementary to the clock signal $H_M$ via an inverter constituted by a transistor 14.

It will be readily apparent that, in the case of the half-adder as in the case of the master-slave flip-flop, all the transistors are suitably fed from a source $V_{DD}$ via load resistors. It would clearly serve no purpose, however, to go into details in regard to polarization or biasing since this is subject to change if the transistors employed are not field-effect transistors but bipolar transistors.

FIG. 4 is a block diagram showing a synchronous binary counter or frequency synthesizer. A changeover from one device to the other calls only for a slight modification which will be explained hereafter. This diagram is more complete than the arrangement shown in FIG. 1. Again as in FIG. 1, however, the counter includes a plurality of cascade-connected stages. In each stage, the half-adder $A_1$ has two inputs $B_1$ and $C_1$ as well as two outputs consisting of a "sum" output $S_1$ and a "carry" output $R_1$. Each master-slave flip-flop has two inputs $S_1$ and a forcing input R/S, one output $Q_1$ and three control inputs $H_M$, $H_E$ ($=\overline{H}_M$) and SYN. Within one stage, the output S of the adder feeds the input of the flip-flop and the output Q of the flip-flop is connected in a feedback loop to the input C of the adder. Between two stages, the output $R_{N-1}$ of one stage is cascade-connected to the input $B_N$ of the following stage. The controls $H_M$, $H_E$ and SYN are in fact connected together, each within its own group.

When the circuit described in the foregoing is operated as a synchronous binary counter, the input $B_1$ is the input of the circuit for the number to be counted, the forcing inputs $R/S_1, \ldots R/S_N$ are connected to ground and the output $R_N$ of the last stage is out of service. The outputs of the counter are the outputs $Q_1, \ldots Q_N$ of the stages. The counter can be reset to zero each time a logical "1" signal controls the synchronization SYN.

When said circuit is used as a programmable divider, the input $B_1$ is fixed at the logical level 1, the forcing inputs $R/S_1, \ldots R/S_N$ are activated but no longer connected to ground as in the previous instance and the output $R_N$ of the last stage is connected to the synchronization inputs SYN as represented by a dashed line in FIG. 4. The circuit divides its own clock frequency which is delivered at the single output terminal $Q_N$.

If further reference is made to the progression table drawn-up earlier and consideration is given to the cycle 7 in which $R_3 = 1$ (and of course to a three-stage counter), two cases may arise:

if $R/S_1 = R/S_2 = R/S_3 = 0$, the master flip-flop is not forced and the table is as follows:

|  | $R_3$ | $Q_1$ | $Q_2$ | $Q_3$ |
|---|---|---|---|---|
| Cycle 7 | 1 | 1 | 1 | 1 |
| Cycle 8 | 0 | 0 | 0 | 0 |

The cycle 8 is identical with the cycle 0 and the divider divides by 8.

If $R/S_1 = 1$, $R/S_2 = R/S_3 = 0$, the master flip-flop $M_1$ is forced and the table is as follows:

|  | $R_3$ | $Q_1$ | $Q_2$ | $Q_3$ |
|---|---|---|---|---|
| Cycle 7 | 1 | 1 | 1 | 1 |

-continued

| | R₃ | Q₁ | Q₂ | Q₃ |
|---|---|---|---|---|
| Cycle 8 | 0 | 1 | 0 | 0 |

The cycle 8 is identical with the cycle 1 and the divider, which has a period of 7, divides by 7.

In more general terms, if N is the number of stages of a divider circuit and if P is the binary number (0 or 1) of the R/S forcing control, the frequency divider in accordance with the invention divides in a ratio $2^N-P$.

This type of counter is of very general use and operates over a very broad range of frequencies. However, it has been studied more specifically with a view to integration in applications relating to microwave data-processing fields.

What is claimed is:

1. A binary counter comprising a plurality of cascaded single-output elementary binary counters each including a half-adder having two inputs as well as a "sum" output and a "carry" output and further including a master-slave flip-flop both having separate clock inputs, wherein:

The first input of the half-adder constitutes the input of the elementary counter;

a means for supplying a "forcing" signal to said half-adder;

the "sum" output of the half-adder is connected directly to the input of the master flip-flop and which has a second input which is connected to said means for supplying a "forcing" signal;

the "carry" output of the half-adder delivers a signal which is utilized as the input of a succeeding half adder in said plurality of counters;

and as a synchronization signal at the input of said master flip-flop;

the output of the master flip-flop is connected directly to the input of the slave flip-flop;

the output of the slave flip-flop which constitutes the binary output of each of the counters is also connected to the second input of the half-adder;

the master and slave flip-flops are controlled in addition by a single clock signal having one waveform applied to the master flip-flop's clock input and a complementary waveform applied to the slave flip-flop's clock input.

2. A synchronous binary counter according to claim 1, wherein the master flip-flop is provided in the case of each elementary counter with two inputs synchronized by two clock and synchronization signals, the first input being connected to the "sum" output of the half-adder of the elementary counter, the second input being intended to constitute the forcing input of the master flip-flop.

3. A synchronous binary counter according to claim 2, wherein zero-resetting is performed by means of a logical "1" signal on the synchronization input.

4. A programmable frequency divider, wherein said divider is constituted by a binary counter according to claim 2, the input of said binary counter being maintained at the logical level 1 and the "carry" output of the last elementary counter being connected to the synchronization line, a signal delivered on the output of the last elementary counter of said divider being such as to correspond to its own clock frequency divided by a factor programmed by the binary values of the forcing inputs.

5. A frequency divider according to claim 4 wherein, if N is the number of elementary counters and if P is the binary number (logical "0" or logical "1") of the forcing inputs, said divider divides in the ratio $2^N-P$.

* * * * *